Nov. 6, 1956 M. C. KIDD ET AL 2,769,906

JUNCTION TRANSISTOR OSCILLATOR CIRCUITS

Filed April 14, 1954

INVENTORS
Marshall C. Kidd
& Werner Hasenberg
BY H. D. Newton
ATTORNEY

United States Patent Office 2,769,906

Patented Nov. 6, 1956

2,769,906

JUNCTION TRANSISTOR OSCILLATOR CIRCUITS

Marshall C. Kidd, Haddon Heights, and Werner Hasenberg, Camden, N. J., assignors to Radio Corporation of America, a corporation of Delaware Application April 14, 1954, Serial No. 423,126

9 Claims. (Cl. 250—36)

This invention relates to electrical signal generators or oscillator circuits and in particular to such circuits utilizing semi-conductor devices of the junction type.

The recent development of commercially useful semi-conductor devices of the type employing a semi-conductive element having three contacting electrodes has already had a decided effect upon, and has caused the introduction of many new techniques in the electronic signal communication field. These devices, known extensively as "transistors," are small in size especially when compared with the ordinary vacuum tube, require no heater power, are very durable and consist of materials which appear to have a long useful life. Therefore, the use of transistors for oscillator as well as other circuit applications has been the subject of extensive investigation.

Transistors, as is well known, are of two general classes which are known as the point-contact transistor and the junction transistor. Each of these classes is known to exhibit different characteristics which have made one class preferable to the other for certain circuit applications.

The current gain of junction transistors, as defined by the ratio of collector electrode current increments to emitter electrode current increments is less than unity. This characteristic of the junction type transistor has apparently made its application to oscillator circuits less convenient than the point-contact type. Point-contact transistors, as is well known in the art, may be current multiplication devices and may, under certain conditions, exhibit a negative resistance. Thus, oscillators have been designed using point-contact transistors which do not require an external feedback path. Heretofore, however, it has been generally considered necessary to provide an external feedback path to sustain oscillations in those circuits utilizing junction transistors.

It is known, however, that junction transistors may also exhibit a negative resistance characteristic over a portion of their operating region. This may be accomplished by applying a fixed voltage to the base of the transistor. The polarity of the biasing sources are chosen so that an operating bias voltage is applied between the base and emitter of the transistor in a relatively conducting or forward direction, and an operating bias voltage is applied between the base and collector in a relatively non-conducting or reverse direction. This negative resistance characteristic of the junction transistor is used to sustain oscillations in a parallel resonant tuned circuit. While sustain oscillation of a circuit utilizing a junction transistor without an external feedback path is thus possible, such a circuit operates at relatively low collector voltages and high collector currents.

In general, the relative stability of the operating characteristics of junction transistors recommends their use for most circuit applications. It has been found, for example, that due to the stability of the characteristics of junction transistors, their performance may be predicted with relative accuracy in various circuit applications. In addition, the noise level of junction transistors is relatively low.

For these as well as other advantages, many types of signal conveying and translating systems may use junction transistors in the various amplifying and signal translating stages. Because of the simplicity of known point-contact transistor oscillator circuits, however, these systems may utilize oscillator circuits of this latter type. It is obvious, of course, that the exclusive use of one type of transistor in these systems, whether it be of the point-contact or junction type, is a decided advantage. Obviously, using one transistor type exclusively simplifies repair procedures when transistors need replacing. In addition, it permits the various transistor units to be normally interchangeable.

One of the most important types of transistor oscillator circuits is the relaxation oscillator. This is especially true because normally power generation of the relaxation oscillator circuit is not necessary and transistors are in general low power devices. A relaxation oscillator circuit may be defined as one in which the frequency is controlled by the periodic charge and discharge of a capacitor through a resistor. While the application of transistors to relaxation oscillator circuits is known, these applications have usually involved the use of point-contact devices.

It is, accordingly, an object of the present invention to provide an improved and simplified oscillator circuit which utilizes a semi-conductor device of the junction type.

It is a further object of the present invention to provide an improved low cost and extremely efficient electrical signal generator circuit utilizing a junction transistor operative at high collector voltages and low collector currents.

It is still another object of the present invention to provide a simple and efficient semi-conductor relaxation oscillator circuit utilizing a transistor of the junction type wherein external feedback means may be eliminated.

It is yet another object of the present invention to provide an improved oscillator circuit which utilizes a negative resistance characteristic of a junction transistor to establish and maintain stabilized relaxation oscillations.

These and further objects and advantages of the present invention are achieved by the discovery, in accordance with the invention, that junction transistors may exhibit a negative resistance characteristic over a portion of their operating region if a reverse bias voltage is applied between the emitter and base electrodes of the transistor as well as between its collector and base. The biasing voltages are so adjusted that the negative resistance operation occurs near collector breakdown potential. This negative resistance characteristic of junction transistors is used in accordance with the invention to provide improved and simplified relaxation oscillator circuits. Thus, a junction transistor oscillator circuit is possible without the provision of external feedback which is characterized by stable and efficient operation at high collector voltages and low collector currents.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
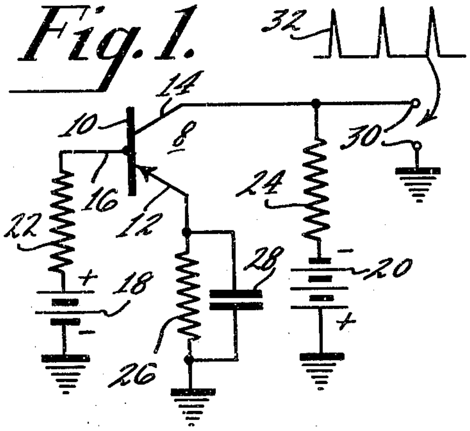
Figures 1, 3 and 5 are schematic circuit diagrams of transistor oscillator circuits utilizing a P—N—P junction transistor connected in accordance with the present invention.

Referring now to the drawing, wherein like elements are designated by like reference numerals throughout the figures, and referring particularly to Figure 1, a junction transistor 8 of the P—N—P type includes a semi-conductive body 10 and three contacting electrodes which have been designated as an emitter 12, a collector 14 and a base 16. To provide proper biasing potentials for oscillator operation, in accordance with the invention, the base 16 is connected to the positive terminal of a battery 18 through a resistor 22. The negative terminal of the battery 18 is returned to a source of fixed reference potential or ground for the system as shown.

Further in accordance with this embodiment of the invention a resistive-capacitive (RC) time constant network is connected with the emitter of the transistor 8. To this end, the emitter 12 is connected through a resistor 26 to ground, and a capacitor 28 is connected in parallel with the resistor 26 between the emitter and ground. It will thus be noted that in contradistinction to the biasing for normal amplifying action of a P—N—P transistor, the emitter 12 is negative with respect to the base 16. That is, the emitter 12 is biased, in accordance with the invention, in a non-conducting or reverse direction with respect to the base 16. It has been discovered, in accordance with the invention, that by providing a bias voltage in this polarity between the emitter and base of a junction transistor and operating at substantially the collector breakdown potential of the transistor, it will exhibit a negative resistance characteristic over a portion of its operating range. This negative resistance characteristic is used in combination with the RC time-constant network to provide a simple and efficient relaxation oscillator circuit.

To provide a biasing voltage source for the collector 14, it is connected through a load resistor 24 to the negative terminal of the biasing battery 20, the positive terminal of which is grounded. Thus, the collector 14 will be biased by a negative voltage. Accordingly, the collector 14 is referred to as being biased in a relatively non-conducting or reverse direction with respect to the base 16.

The output relaxation oscillatory energy may be taken from a pair of output terminals 30, one of which is connected directly with the collector 14, and the other of which is grounded as shown.

In operation it is assumed that the transistor circuit of Figure 1 is in a stable state of low current conduction. It is also assumed that the capacitor 28 of the RC time-constant network is initially uncharged. The capacitor 28 is slowly charged by the flow of emitter current to a value equal to the voltage drop across the resistor 26. Eventually, capacitor 28, and consequently the emitter 12, will acquire such a negative potential with respect to ground that the junction transistor 8 is operative as a negative resistance device. At this point the collector voltage will be slightly less than the breakdown voltage. The transistor circuit at this point is in an unstable high current conduction state. This negative resistance characteristic is shown by the curve illustrated in Figure 2 wherein collector current has been plotted against collector voltage for a junction transistor of the type illustrated in Figure 1.

As soon as the voltage applied to the electrodes of the transistor 8 are such that this negative resistance region is reached, the capacitor 28 will discharge. This action produces a sawtooth collector voltage wave which is obtained at the output terminals 30 and is indicated generally by the reference numeral 32 in Figure 1. The transistor circuit then returns to its initial stable state of low current conduction. This cycle then repeats producing a series of sawtooth voltage waves as shown in Figure 1. These voltage waves are characterized by their extremely rapid rise time which approximates .01 microsecond in the typical oscillator circuit. Moreover, as shown by the curve in Figure 2 this negative resistance characteristic is obtained at high collector voltages which approximate the collector breakdown potential of the transistor and at relatively low collector currents.

It has been found that the battery 18 may be eliminated and self-bias utilized to provide the reverse bias between the emitter 12 and the base 16. It has also been found that by increasing the reverse bias between the emitter and base or in other words, making the emitter 12 more negative with respect to the base 16, the magnitude of the critical collector voltage beyond which the negative resistance characteristic appears may be increased. This may be accomplished, for example, by varying the base voltage. It is also possible to control the amplitude of the oscillations by varying the base voltage of the transistor.

A relaxation oscillator which is synchronized by the application of trigger pulses to the base may also be provided in accordance with the invention. Thus an oscillator circuit in accordance with the invention may be pulsed on and off by the application of these pulses to the base. Thus, if the base 16 is driven positively with respect to the emitter 12 at some time during the charging cycle, which is prior to the time when the oscillator circuit would normally go into its unstable high current conduction state, it will be triggered into a high current state by the application of the positive pulse to the base. Hence, if the frequency of the oscillator circuit is slightly below the frequency at which it is desired to synchronize the relaxation oscillator circuit, a positive pulse applied to the base 16 will trigger the relaxation oscillator circuit slightly ahead of its normal reaction time. As a result, the frequency of the circuit will be somewhat higher than the frequency without the trigger pulses.

Moreover, the frequency of operation may be varied by changing the parameters of the circuit components comprising the RC time-constant network. This may be accomplished, for example, by making the resistor 26 or the capacitor 28, or both, variable. Thus, effective and reliable control of the operating point of a transistor oscillator circuit of the type described is possible, and the frequency as well as the amplitude of the oscillator signal may be varied within quite wide limits.

Figure 3:
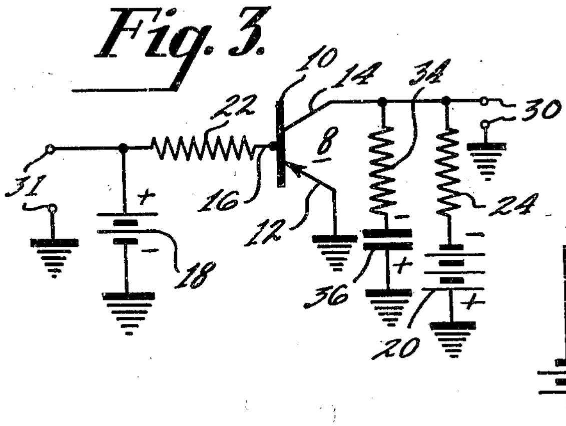

While it will be understood that the circuit specifications may vary according to the design for any particular application, the following circuit specifications are included for the circuit of Figure 1, by way of example only:

Resistors 22, 24 and 26—15,000; 4700; and 1000 ohms, respectively
Capacitor 28—.05 microfarads
Batteries 18 and 20—3 and 40 volts, respectively It is also possible, in accordance with the present invention, to connect a series RC timing network with the collector of a junction transistor to provide a relaxation oscillator circuit which operates by virtue of the aforementioned negative resistance characteristic. To this end, as shown in Figure 3, a resistor 34 and a capacitor 36 are connected in series between the collector 14 and a source of fixed reference potential or ground for the system. The emitter 12 is connected directly to ground as shown. A pair of input terminals 31 are also shown, one of which is grounded and the other of which is connected through the resistor 22 to the base 16 of the P—N—P junction transistor 8. Trigger pulses may be applied to the base 16 through the terminals 31 to provide synchronization of the oscillator circuit as described in connection with Figure 1.

In other respects the oscillator circuit shown in Figure 3 is identical to the one shown in Figure 1. Thus, the base 16 is connected through the resistor 22 to the positive terminal of the biasing battery 18, the negative terminal of which is grounded as shown. Thus, the emitter 12 will be biased in the relatively non-conducting or reverse direction with respect to the base 16. Collector biasing voltage is obtained by connecting the collector 14 through the resistor 24 to the negative terminal of the biasing battery 20, the positive terminal of which is grounded. Hence, the collector 14 will also be biased in a relatively non-conducting or reverse direction with respect to the base 16.

In operation, the circuit illustrated in Figure 3 is also similar to the one illustrated in Figure 1. Thus, the capacitor 36 will slowly charge through the resistor 34 until the collector 14 acquires such a negative voltage with respect to ground that the transistor 8 is operative as a negative resistance device. The transistor circuit at this point is in an unstable high-current conduction state.

As soon as the voltages applied to the electrodes of the transistor 8 are such that this negative resistance region is reached, the capacitor 36 will discharge. This action produces a sawtooth collector voltage wave which is obtained at the output terminals 30 and is substantially identical to the waveform indicated by the reference numeral 32 in Figure 1. The transistor circuit then returns to its initial stable state of low current conduction. This cycle then repeats, producing a series of sawtooth voltage waves.

Figure 4:
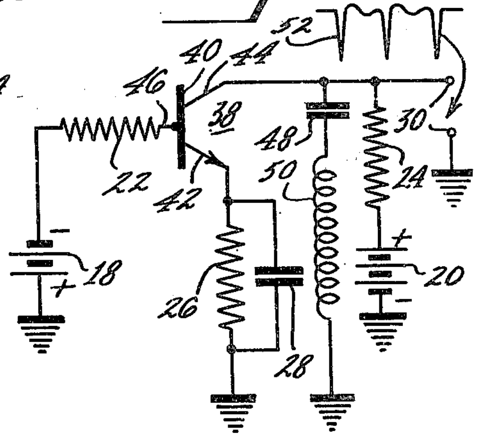
Figure 4 is a schematic circuit diagram of a transistor oscillator circuit utilizing an N—P—N junction transistor connected in accordance with the present invention.

As was mentioned hereinbefore, the invention is not restricted to any one conductivity type of junction transistor. Thus, as shown in Figure 4, an N—P—N junction transistor 38 may be utilized. The transistor 8 includes a semi-conductive body 40 and three contacting electrodes which have been designated as an emitter 42, a collector 44 and a base 46. To provide proper biasing potentials for oscillator operation, in accordance with this embodiment of the invention, the base 46 of the transistor 38 is connected through a resistor 22 to the negative terminal of a battery 18, the positive terminal of which is connected to a source of fixed reference potential or ground for the system as shown.

As in Figure 1, the emitter 42 of the N—P—N junction transistor 38 is connected through the resistor 26 to ground, and a capacitor 28 is connected in parallel with the resistor 26 between the emitter and ground. The resistor 26 and the capacitor 28, it should be understood, comprise the RC time-constant network for the relaxation oscillator circuit.

As described, it will be noted that in contradistinction to the biasing for normal amplifying action of an N—P—N transistor, the emitter 42 is positive with respect to the base 46. That is, the emitter 42 is biased, in accordance with the invention, in a non-conducting or reverse direction with respect to the base 46. Thus, by providing a bias voltage of this polarity between the emitter and base of an N—P—N junction transistor and operating at high collector voltages, the transistor will exhibit a negative resistance characteristic over a portion of its operating range. This negative resistance characteristic is used in combination with the RC time-constant network to provide a simple and efficient relaxation oscillator circuit.

To provide a biasing voltage source for the collector 44, it is connected through the load resistor 24 to the positive terminal of the biasing battery 20, the negative terminal of which is grounded as shown. Thus, the collector 44 will be biased by a positive voltage. Accordingly, the collector 44 is referred to as being biased in a relatively non-conducting or reverse direction with respect to the base 46.

The output relaxation oscillatory energy may be taken from a pair of output terminals 30, one of which is connected directly with the collector 44, and the other of which is grounded as shown.

Thus, the circuit illustrated in Figure 4 is seen to be substantially identical with the one illustrated in Figure 1, the difference being in the polarity of the biasing sources since a P conductivity type junction transistor is utilized. In addition, a series inductance-capacitance (LC) network is connected between the collector and ground and provides sine wave stabilization for the relaxation oscillator circuit, insuring thereby accurate timing of the sawtooth wave form. To this end, a capacitor 48 and an inductor 50 are connected in series between the collector 44 and ground as shown. The capacitor 48 and the inductor 50 are preferably chosen to be series resonant at the frequency of oscillation.

In operation, the circuit illustrated in Figure 4 is also similar to the operation of the circuit illustrated in Figure 1, the difference being in the polarity of the voltage which is developed across the capacitor 28 which serves to place the transistor in the negative resistance region. In addition, the sawtooth output wave which is taken from the terminals 30 is opposite in polarity to the output signal of the circuit shown in Figure 1, as shown by the reference numeral 33. The influence of the sine wave stabilization is also shown by the sine waves which are located between the output sawtooth pulses. It is noted that a circuit of this type may be also synchronized—in this case by the application of negative pulses to the base 46.

Figure 5:
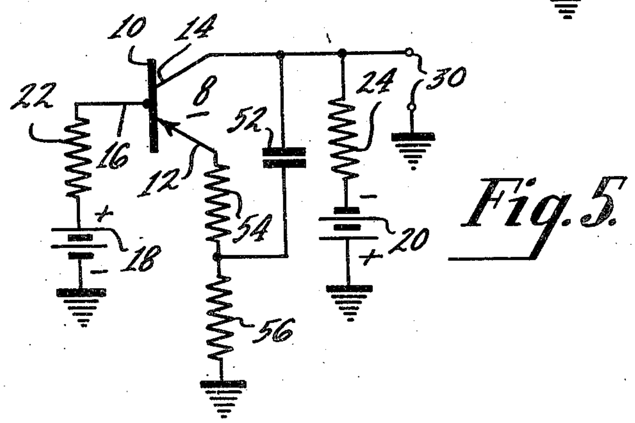

In Figure 5, the P—N—P junction transistor 8 is biased in the same manner as in Figures 1 and 3. In this embodiment of the invention, however, the emitter 12 is connected through a current limiting resistor 54 and a biasing resistor 56 to ground as shown. In addition, a storage capacitor 52 is connected between the collector 14 and the junction of the resistors 54 and 56.

Figure 2:
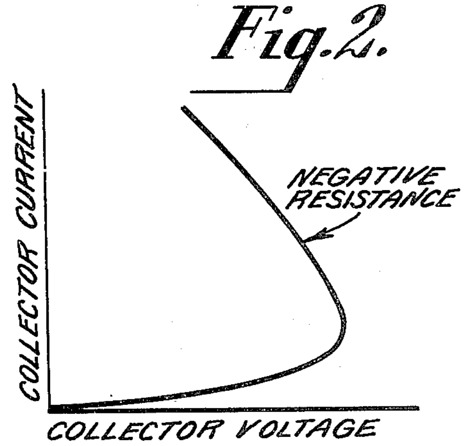
Figure 2 is a graph showing a curve relating collector current to collector voltage of a transistor of the type illustrated in Figure 1.

The operation of the circuit illustrated in Figure 5 is similar to the operation of the circuits which have previously been described. Thus, as the storage capacitor 52 is charged, the charging current decreases and the collector 14 will become more negative. Moreover, the voltage existing between the base 16 and the emitter 12 will be reduced. This action will trigger the transistor 8 into the negative resistance region as previously described and as shown in Figure 2 of the drawing. Consequently, the transistor will be in an unstable high-current condition. This provides a discharge path for the storage capacitor 52 through the resistor 54, the emitter 12 and the collector 14 of the transistor 8. The transistor 8 then returns to its stable low-current conduction condition and the cycle is repeated. A sawtooth waveform of the type shown in Figure 1 may then be taken from the output terminals 30.

As described herein, improved oscillator circuits in accordance with the invention employ a junction transistor and are characterized by their low cost and efficiency. The frequency as well as the stability of such circuits are easily and effectively controlled and may be synchronized by the application of input signals. Moreover, the invention provides relatively stable circuits which utilize a minimum number of circuit elements, thus achieving simplicity with reliability.

What is claimed is:

1. In an oscillator circuit, the combination with a semi-conductor device of the junction type having a semi-conductive body, and a base electrode, a collector electrode and an emitter electrode, means providing a first direct current bias voltage source connected in said circuit to apply a bias voltage of one polarity relative to a point of reference potential to said collector electrode to provide a bias voltage in the relatively non-conducting reverse direction between said collector and base electrodes, means providing a second direct-current bias voltage source connected in said circuit to apply a bias voltage of an opposite polarity relative to said point of reference potential to said base electrode to provide a bias voltage in the relatively non-conducting reverse direction between said emitter and base electrodes to provide a negative resistance characteristic over a portion of the operating range of the oscillator circuit, and a frequency determining circuit connected with one of said emitter and collector electrodes and operative to control the frequency of oscillation of said circuit.

2. In a triggered relaxation oscillator, the combination comprising, a junction transistor having base, emitter and collector electrodes cooperatively associated therewith, a time-constant network connected with said emitter electrode and including a first resistor and a storage capacitor connected in parallel therewith, charging means for said storage capacitor including a serially connected second resistor and a first source of voltage connected between said collector electrode and a point of fixed reference potential in said circuit, a serially connected third resistor and a second source of voltage connected between said base electrode and said point of fixed reference potential and adapted to normally provide a reverse bias voltage between said emitter and base electrodes, a signal input circuit connected with said base electrode for applying thereto trigger pulses having a polarity to bias said base and emitter electrodes in a reverse direction whereby said transistor exhibits a negative resistance characteristic and said storage capacitor is discharged when it has previously been charged, and an output circuit connected with said collector electrode for deriving a sawtooth wave from said oscillator.

3. In a triggered relaxation oscillator, the combination comprising, a junction transistor having base, emitter and collector electrodes cooperatively associated therewith, a time-constant network connected with said collector electrode and including a serially connected first resistor and a storage capacitor, charging means for said storage capacitor including a serially connected second resistor and a first source of voltage connected between said collector electrode and a point of fixed reference potential in said circuit, a serially connected third resistor and a second source of voltage connected between said base electrode and said point of fixed reference potential and adapted to normally provide a reverse bias voltage between said emitter and base electrodes, a signal input circuit connected with said base electrode for applying thereto trigger pulses having a polarity to bias said base and emitter electrodes in a reverse direction whereby said transistor exhibits a negative resistance characteristic and said storage capacitor is discharged when it has previously been charged, and an output circuit connected with said collector electrode for deriving a sawtooth wave from said oscillator.

4. A semi-conductor relaxation oscillator circuit, comprising in combination, a semi-conductor device including a semi-conductive body of the junction type, and a base electrode, a collector electrode and an emitter electrode, means providing a first direct current bias voltage source connected in said circuit to apply a bias voltage of one polarity relative to a point of reference potential to said collector electrode to provide a bias voltage in the relatively non-conducting reverse direction between said collector and base electrodes, means providing a second direct-current bias voltage source connected in said circuit to apply a bias voltage of an opposite polarity relative to said point of reference potential to said base electrode to provide a bias voltage in the relatively non-conducting reverse direction between said emitter and base electrodes wherein said device exhibits a negative resistance characteristic over a portion of the operating range of said oscillator circuit, a first resistor connected between said first source and said collector electrode, a second and a third resistor connected with said emitter electrode, and a storage element connected between said collector electrode and a point intermediate said second and third resistors.

5. In a relaxation oscillator circuit for providing oscillator signals over a range of frequencies, the combination comprising a semi-conductor device having a semi-conductive body of the junction type and an emitter, a base and a collector electrode cooperatively associated therewith, means providing a point of fixed reference potential in said circuit, a first source of operating voltage of one polarity relative to said point of reference potential serially connected between said base electrode and said point of reference potential, conductive circuit means connecting said emitter electrode with said point of reference potential to bias said emitter electrode in a relatively non-conducting direction with respect to said base electrode, and a second source of operating voltage of an opposite polarity relative to said point of reference potential connected between said collector electrode and said point of reference potential to bias said collector electrode in a relatively non-conducting direction with respect to said base electrode, said operating voltages being effective for biasing said electrodes to an operating level wherein said device exhibits a negative resistance characteristic over a portion of the operating range of said oscillator circuit.

6. A relaxation oscillator circuit as defined in claim 5 wherein said conductive circuit means comprises a time-constant network including a resistor and parallel capacitor, said time constant network being operative to control the frequency of oscillation of said circuit.

7. A relaxation oscillator circuit as defined in claim 6 wherein stabilization means comprising a serially connected capacitor and inductor is connected between said collector electrode and said source of reference potential.

8. A relaxation oscillator circuit as defined in claim 5 wherein a time constant network including a serially connected capacitor and resistor is connected between said collector electrode and said source of reference potential, said time constant network being operative to control the frequency of oscillation of said circuit.

9. A relaxation oscillator circuit as defined in claim 5 wherein said conductive circuit means comprises a resistor connected between said emitter electrode and said source of reference potential, and wherein a capacitor is connected between said collector electrode and an intermediate point of said resistor.

References Cited in the file of this patent

UNITED STATES PATENTS

| | | |
|---|---|---|
| 2,657,360 | Wallace | Oct. 27, 1953 |
| 2,663,800 | Herzog | Dec. 22, 1953 |
| 2,681,993 | Shockley | June 22, 1954 |